United States Patent
Oh et al.

(10) Patent No.: US 8,111,348 B2
(45) Date of Patent: *Feb. 7, 2012

(54) LIQUID CRYSTAL DISPLAY DEVICE WITH POLARIZING FILTER IN HOUSING TO BLOCK OUTSIDE LIGHT

(75) Inventors: Pil-yong Oh, Suwon-si (KR); Il-yong Jung, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/087,574

(22) Filed: Apr. 15, 2011

(65) Prior Publication Data

US 2011/0187962 A1    Aug. 4, 2011

Related U.S. Application Data

(63) Continuation of application No. 12/197,755, filed on Aug. 25, 2008, now Pat. No. 7,948,575.

(30) Foreign Application Priority Data

Dec. 7, 2007   (KR) .............................. 2007-0127207
May 21, 2008   (KR) .............................. 2008-0047241

(51) Int. Cl.
  *G02F 1/1333* (2006.01)
  *G02F 1/1335* (2006.01)
(52) U.S. Cl. .................... 349/58; 349/96; 349/97; 349/9
(58) Field of Classification Search ................ 349/58, 349/96, 97, 9
  See application file for complete search history.

(56) References Cited

U.S. PATENT DOCUMENTS

| 5,027,111 A | 6/1991 | Davis et al. |
| 7,408,696 B2 * | 8/2008 | Liang et al. .................. 359/296 |
| 7,948,575 B2 * | 5/2011 | Oh et al. ......................... 349/58 |
| 2002/0085151 A1 * | 7/2002 | Faris et al. .................... 349/117 |

FOREIGN PATENT DOCUMENTS

| EP | 0638832 | | 2/1995 |
| EP | 1253459 | | 10/2002 |
| JP | 2006-039344 | | 2/2006 |
| JP | 2007-065137 | | 3/2007 |
| JP | 2007065137 A | * | 3/2007 |
| KR | 2003-57218 | | 7/2003 |

OTHER PUBLICATIONS

European Search Report issued Aug. 12, 2009 in EP Application No. 09151616.1.
European Office Action issued Apr. 15, 2011 in EP Application No. 09151616.1.

* cited by examiner

*Primary Examiner* — Mike Qi
(74) *Attorney, Agent, or Firm* — Stanzione & Kim, LLP

(57) ABSTRACT

A liquid crystal display device includes a housing, a liquid crystal panel provided in the housing and comprises first and second transparent substrates spaced from each other at predetermined intervals, a sealing member to seal an internal space formed between the first and second transparent substrates, a liquid crystal to fill the internal space, first and second transparent electrodes formed in the first and second transparent substrates, respectively, and a polarizing plate to transmit light in a predetermined polarizing direction, a backlight unit disposed in the housing to emit surface light to the liquid crystal panel, and a polarizing filter disposed in the housing, and spaced from the liquid crystal panel at predetermined intervals to transmit predetermined polarized light and to block other polarized light of incident light.

13 Claims, 5 Drawing Sheets

LIQUID CRYSTAL DISPLAY DEVICE WITH POLARIZING FILTER IN HOUSING TO BLOCK OUTSIDE LIGHT

CROSS-REFERENCE TO RELATED APPLICATIONS

This is a Continuation Application of U.S. application Ser. No. 12/197,755, filed on Aug. 25, 2008, now U.S. Pat. No. 7,948,575, which claims priority under 35 U.S.C. §119(a) from Korean Patent Application No. 10-2007-0127207, filed on Dec. 7, 2007 and Korean Patent Application No. 10-2008-0047241, filed on May 21, 2008 in the Korean Intellectual Property Office, the disclosure of which is incorporated herein in its entirety by reference.

BACKGROUND OF THE INVENTION

1. Field of the Invention

The present general inventive concept relates to a liquid crystal display device, and more particularly, to a liquid crystal display device to be installed outdoors.

2. Description of the Related Art

Generally, a liquid crystal display (LCD) device is a type of a flat panel display device, and includes a backlight unit emitting light and a liquid crystal panel selectively transmitting light from the backlight unit to form an image.

As liquid crystal panels have increased in size, demands and application areas for an LCD device having the large-sized liquid crystal panel have sharply increased.

If the LCD device is to be installed outdoors, the liquid crystal panel may be exposed to sunlight having 1 kW/m² radiant energy. In this case, liquid crystals are heated by solar radiant energy, and may not be driven normally. Thus, the successful outside installation of the LCD device is, in reality, unlikely without a sun blocking structure.

FIG. 1 is a perspective view illustrating an LCD device which is installed outdoors with a conventional light blocking plate.

As illustrated therein, the LCD device which can be installed outdoors includes a liquid crystal panel 1, and a light blocking plate 5 disposed in front of the liquid crystal panel 1 to prevent direct rays of light from being incident to the liquid crystal panel 1.

To block sunlight emitted from above and lateral sides, the light blocking plate 5 includes an upper plate 6 provided on the liquid crystal panel 1 and protruding forward, and left and right plates 7 and 8 provided at the left and right sides of the liquid crystal panel 1 and protruding forward.

If the LCD device which can be installed outdoors includes the light blocking plate 5 as described above, the direct rays of light is prevented from being incident to the liquid crystal panel 1.

However, the installed light blocking plate 5 narrows a viewing angle, and limits a viewing direction. Also, additional space is required to install the light blocking plate 5.

SUMMARY OF THE INVENTION

The present general inventive concept provides a LCD device to block light not contributing to displaying images among solar radiant energy incident to a liquid crystal panel, without an outwardly-protruding light blocking plate, and to protect the liquid crystal panel from the solar radiant energy.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept can be achieved by providing a liquid crystal display device comprising a housing, a liquid crystal panel provided in the housing and comprises first and second transparent substrates spaced from each other at predetermined intervals, a sealing member to seal an internal space formed between the first and second transparent substrates, a liquid crystal to fill the internal space, first and second transparent electrodes formed in the first and second transparent substrates, respectively, and a first polarizing plate to transmit light in a predetermined polarizing direction, a backlight unit disposed in the housing to emit surface light to the liquid crystal panel, and a polarizing filter disposed in the housing, and spaced from the liquid crystal panel at predetermined intervals to transmit predetermined polarized light and to block other polarized light of incident light.

The first polarizing plate may be provided at an outside of the first transparent substrate to face the backlight unit.

The liquid crystal display device may further comprise a second polarizing plate provided at a lateral side of the second transparent substrate.

The polarizing filter and the second polarizing plate may be arranged so that a polarizing direction of light transmitting the polarizing filter is substantially equal to that of light transmitting the second polarizing plate.

The liquid crystal display device may further comprise an infrared filter provided at a lateral side of the polarizing filter to block light in the infrared area among incident light, and an ultraviolet filter provided at a lateral side of the infrared filter and to block light in the ultraviolet area among the incident light.

The liquid crystal display device may further comprise a heat radiating member provided in the housing to cool the liquid crystal panel and the polarizing filter.

The heating radiating member may comprise at least one fan which is provided in the housing to introduce external air to the housing or to discharge internal air of the housing to the outside.

The fan may be provided in a lower rear side of the housing to introduce the external air to a space between the liquid crystal panel and the polarizing filter.

The fan may be provided in an upper rear side of the housing to discharge air from the housing to the outside.

The heat radiating member may comprise a heat absorber provided in the housing to absorb heat, and a heat radiator provided outside of the housing to discharge the heat absorbed by the heat absorber to the outside.

A distance between the liquid crystal panel and the polarizing filter D may satisfy a following formula.

$$0.005 \leq D/L \leq 0.1$$

$$L = (H^2 + W^2)^{1/2}$$

Here, H refers to a height of the liquid crystal panel, W is a width of the liquid crystal panel, D is the distance D between the liquid crystal panel and the polarizing filter, and L is a diagonal length of the liquid crystal panel.

The foregoing and/or other aspects and utilities of the present general inventive concept can be achieved by providing a liquid crystal display device including a liquid crystal panel, one or more polarizing plates to transmit light in a predetermined polarized direction and block other light, and a polarizing filter spaced from the liquid crystal panel at one or more predetermined intervals, and to at least one of reflect and absorb blocked light and to prevent the blocked light from being directly applied to the liquid crystal display.

The foregoing and/or other aspects and utilities of the present general inventive concept can be achieved by providing a liquid crystal display device including a liquid crystal panel to display an image, a backlight unit to emit to emit surface light to the liquid crystal panel, a polarizing filter spaced from the liquid crystal panel at one or more predetermined intervals, and to transmit polarized light and to block other polarized light of incident light, a housing to enclose the liquid crystal panel, the backlight unit and the polarizing filter, and a heat radiating member having a heat absorber to absorb heat from an internal space inside the housing and a heat radiator to discharge the absorbed heat outside the housing.

The heat absorber may be disposed inside the housing and the heat radiator may be disposed outside the housing.

BRIEF DESCRIPTION OF THE DRAWINGS

The above and/or other aspects and utilities of the present general inventive concept will become apparent and more readily appreciated from the following description of the exemplary embodiments, taken in conjunction with the accompanying drawings, in which.

DETAILED DESCRIPTION OF THE PREFERRED EMBODIMENTS

Figure 1:
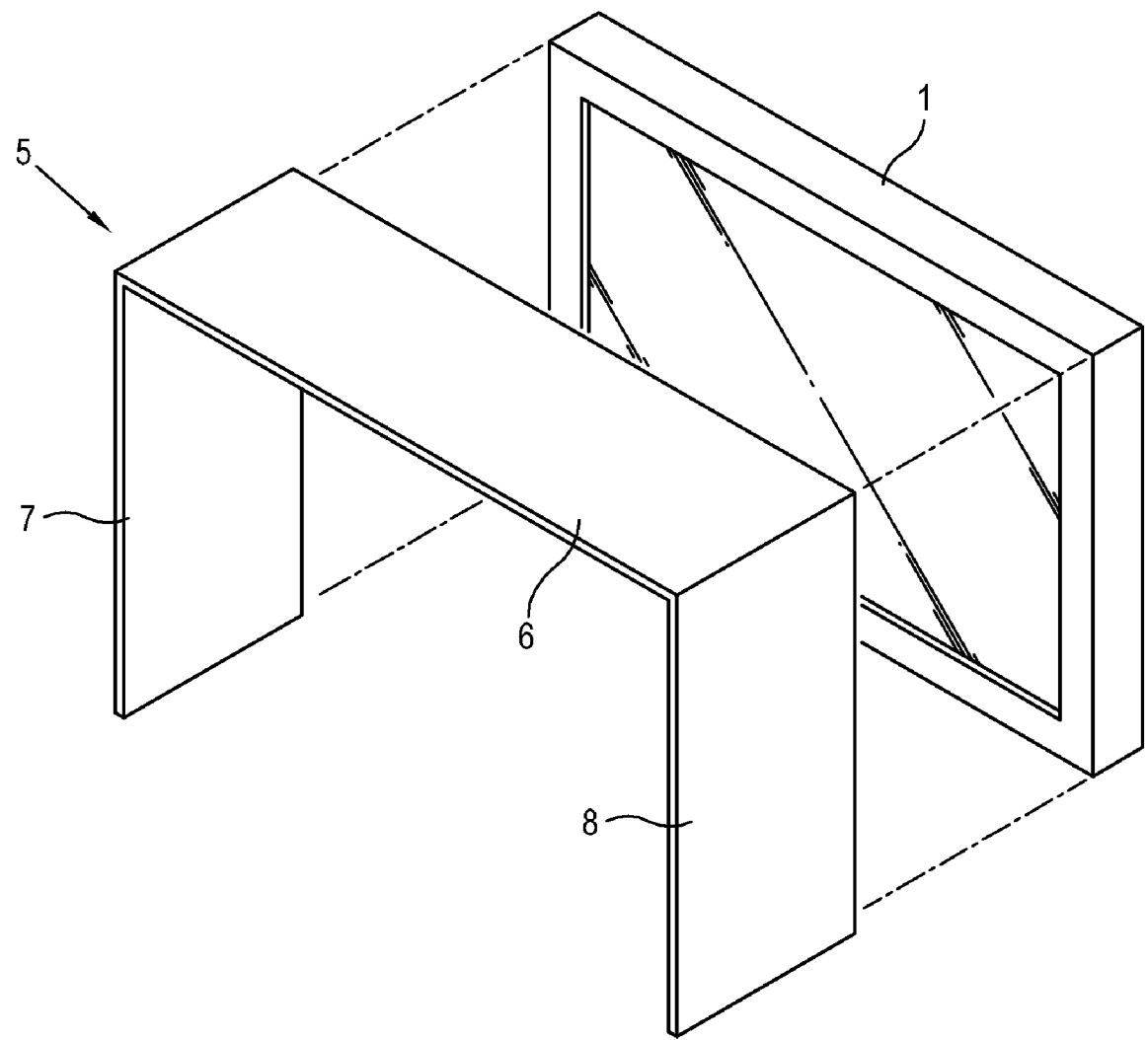
FIG. 1 is a perspective view illustrating a LCD device which is installed outdoors with a conventional light blocking plate.

Reference will now be made in detail to embodiments of the present general inventive concept, examples of which are illustrated in the accompanying drawings, wherein like reference numerals refer to like elements throughout. The embodiments are described below so as to explain the present general inventive concept by referring to the figures.

Figure 2:
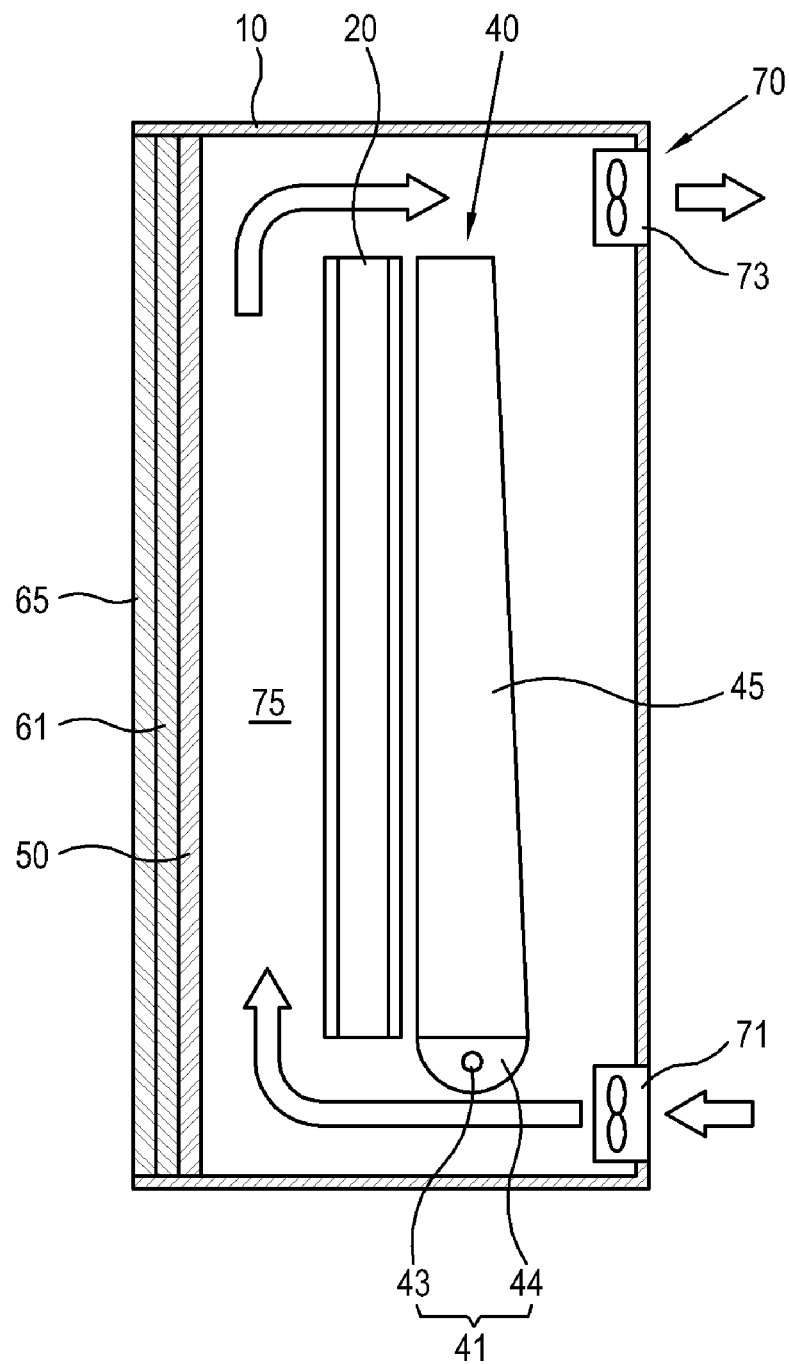
FIG. 2 is a sectional view illustrating a LCD device according to an exemplary embodiment of the present general inventive concept.
Figure 3:
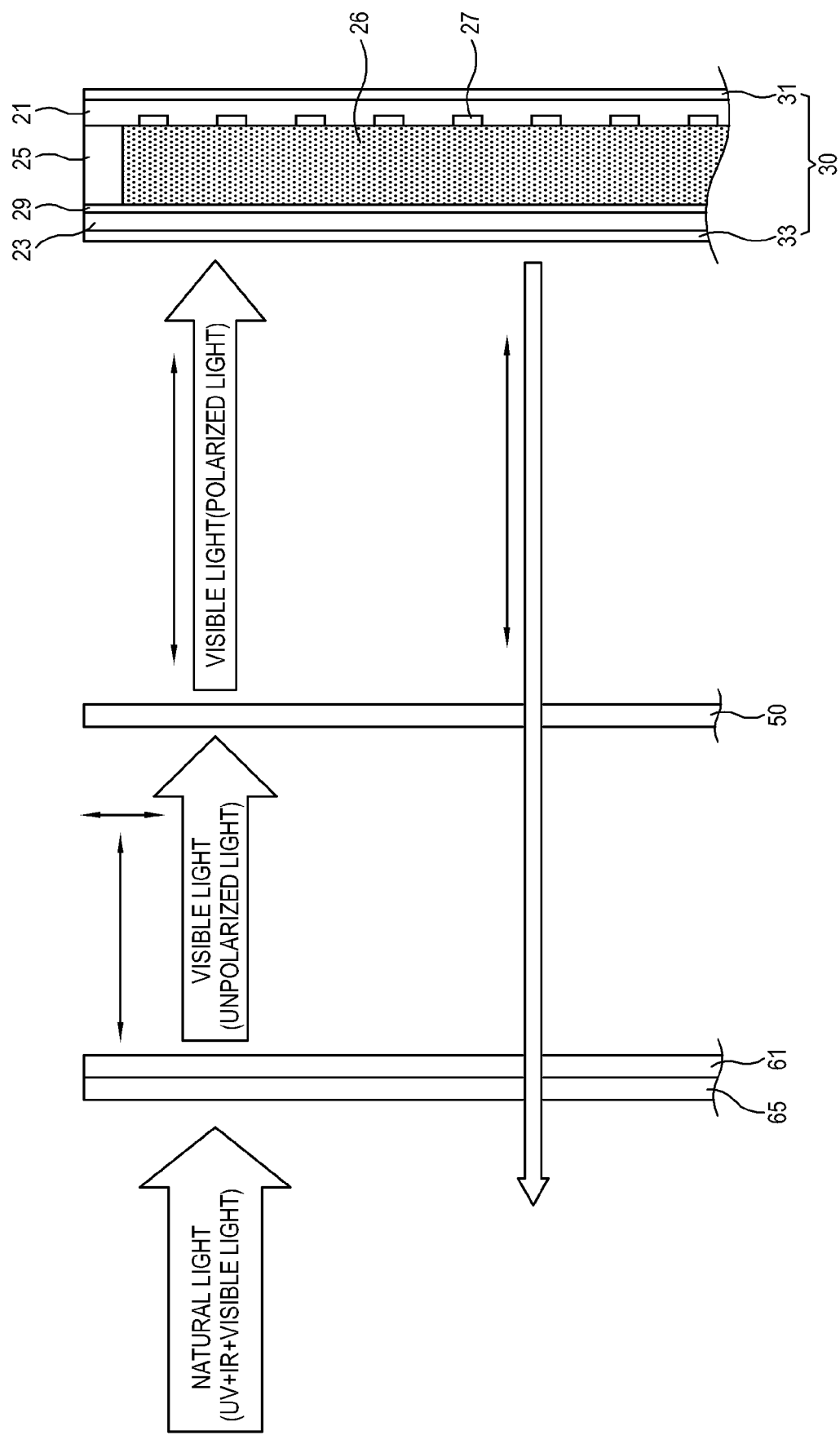
FIG. 3 illustrates a detailed configuration of a liquid crystal panel in FIG. 2 and an external light blocking process of the LCD device in FIG. 2.

FIG. 2 is a sectional view illustrating a LCD device according to an exemplary embodiment of the present general inventive concept. FIG. 3 illustrates a detailed configuration of a liquid crystal panel in FIG. 2 and an external light blocking process of the LCD device in FIG. 2.

As illustrated therein, the LCD device according to the exemplary embodiment of the present general inventive concept includes a housing 10, and a liquid crystal panel 20, a backlight unit 40 and a polarizing filter 50 which are installed in the housing 10.

Referring to FIGS. 2 and 3, the liquid crystal panel 20 is a non-emitter type display panel. The liquid crystal panel 20 selectively transmits light emitted by the backlight unit 40 to each of a plurality of pixels forming an image. The liquid crystal panel 20 includes first and second transparent substrates 21 and 23, a sealing member 25, a liquid crystal 26, first and second transparent electrodes 27 and 29 and a polarizing plate 30.

The first and second transparent substrates 21 and 23 are spaced from each other at predetermined intervals. The liquid crystal 26 is injected between the first and second transparent substrates 21 and 23. The sealing member 25 seals an internal space formed between the first and second transparent substrates 21 and 23.

The first and second transparent electrodes 27 and 29 are stripe-shaped electrodes formed in the first and second transparent substrates 21 and 23, respectively. The first transparent electrode 27 intersects an alignment direction of the second transparent electrode 29. A switching element (not illustrated) is provided at an intersection of the first and second transparent electrodes 27 and 29 and controls power supplied to the first and second transparent electrodes 27 and 29 to turn on and off each pixel of the liquid crystal 26.

The polarizing plate 30 may include a first polarizing plate 31 provided in an external part of the first transparent substrate 21 and a second polarizing plate 33 provided in an external part of the second transparent substrate 23.

The first polarizing plate 31 transmits light in a predetermined polarizing direction. That is, the first polarizing plate 31 transmits specific polarized light emitted by the backlight unit 40 to the liquid crystal 26 and blocks other polarized light. The light which has passed through the first polarizing plate 31 progresses to the second polarizing plate 33, with a polarizing direction determined for each pixel depending on a driving status of the pixel.

The second polarizing plate 33 transmits light in a predetermined polarizing direction and blocks other polarized light. Thus, the liquid crystal panel 20 forms an image by blocking light which has passed through some pixels and by transmitting light which has passed through other pixels, corresponding to the driving status of the liquid crystal 26.

In this embodiment, the polarizing plate 30 includes the first polarizing plate 33 and the second polarizing plate 33, but not limited thereto. Alternatively, the polarizing filter 50 may perform an optical function of the second polarizing plate 33 as described below. Thus, in another embodiment, the second polarizing plate 33 may be removed.

The backlight unit 40 is installed in the housing 10, faces the first polarizing plate 31 and emits surface light to the liquid crystal panel 20.

According to the present embodiment, the backlight unit 40 is an edge emitting type, and includes a light source 41 and a light guiding plate 45 to guide a progress direction of the light emitted by the light source 41. The light source 41 includes a lamp 43 and a reflection mirror 44 to reflect light emitted by the lamp 43 to the light guiding plate 45. The light source 41 may include, for example, at least one light emitting diode (LED) disposed at an edge of the light guiding plate 45. The backlight unit 40 is not limited to the edge emitting type, and may include a direct emitting type.

The polarizing filter 50 is spaced from the liquid crystal panel 20 at predetermined intervals, and transmits predetermined polarized light of incident light and blocks other polarized light. Thus, if the LCD device is installed outdoors, a portion of sunlight incident from the outside is blocked. For example, in the present general inventive concept, approximately 50%, for example, may be blocked. Thus, the liquid crystal panel 20 is prevented from being thermal damaged by sunlight. As the polarizing filter 50 is spaced from the liquid crystal panel 20, light which is absorbed or reflected by the polarizing filter 50 to block sunlight is not directly applied to the liquid crystal panel 20.

To transmit an image formed by the liquid crystal panel 20, the polarizing filter 50 is disposed in consideration of the alignment direction of the second polarizing plate 33. That is, the polarizing filter 50 and the second polarizing plate 33 are arranged so that the polarizing direction of the light transmitting the polarizing filter 50 is substantially equal to that of light transmitting the second polarizing plate 33. As most of the image formed on the liquid crystal panel 20 transmits through the polarizing film 50, a lowering of brightness due to the polarizing filter 50 does not occur.

Here, the polarizing filter 50 transmits light polarized in a predetermined direction therethrough and blocks other polarized light, thereby serving as the second polarizing plate 33. Accordingly, the image can be formed without the second polarizing plate 33.

The LCD device according to the exemplary embodiment of the present general inventive concept may further include an infrared filter 61 and an ultraviolet filter 65 which are provided in the housing 10.

The infrared filter 61 is provided in a lateral side of the polarizing filter 50 and blocks light in the infrared area among incident light. The ultraviolet filter 65 is provided in a lateral side of the infrared filter 61 and blocks light in the ultraviolet area among the incident light.

If the LCD device further includes the infrared filter 61 and the ultraviolet filter 65, infrared rays (IR) and ultraviolet rays (UV) included in the solar radiant energy, i.e., approximately 50% of the solar radiant energy, is blocked.

Thus, about 50% of the incident solar radiant energy is blocked by the infrared filter 61 and the ultraviolet filter 65, and another 50% of the remaining solar radiant energy transmitting the infrared and ultraviolet filters 61 and 65 is blocked by the polarizing filter 50. As a result, only about 25% of the overall radiant energy passes through the filters 61, 65 and 50 and is incident to the liquid crystal panel 20, sharply reducing an impact of the solar radiant energy.

Even if the light blocking plate is not used, the liquid crystal 26 of the LCD device does not rise to a critical temperature.

The LCD device according to another embodiment may further include a heat radiating member 70 to cool the liquid crystal panel 20 and the polarizing filter 50.

The heat radiating member 70 may include at least one fan which is provided in the housing 10.

FIG. 2 illustrates first and second fans 71 and 73 as an example of the heat radiant member 70. Referring to FIG. 2, the first fan 71 is provided in a lower rear side of the housing 10 to introduce external air to a space 75 between the liquid crystal panel 20 and the polarizing filter 50. The second fan 73 is provided in an upper rear side of the housing 10 to discharge air from the housing 10 to the outside.

As described above, if the LCD device includes the first and second fans 71 and 73 as the heat radiating member 70, air circulates in and around the housing 10, and the liquid crystal panel 10 and the polarizing filter 50 may be more efficiently cooled. Since impurities may be introduced to the housing 10 when air circulates in and around the housing 10, an air filter (not illustrated) may be provided in an opening of the housing 10 having the first and second fans 71 and 73 to prevent the impurities.

Figure 4:
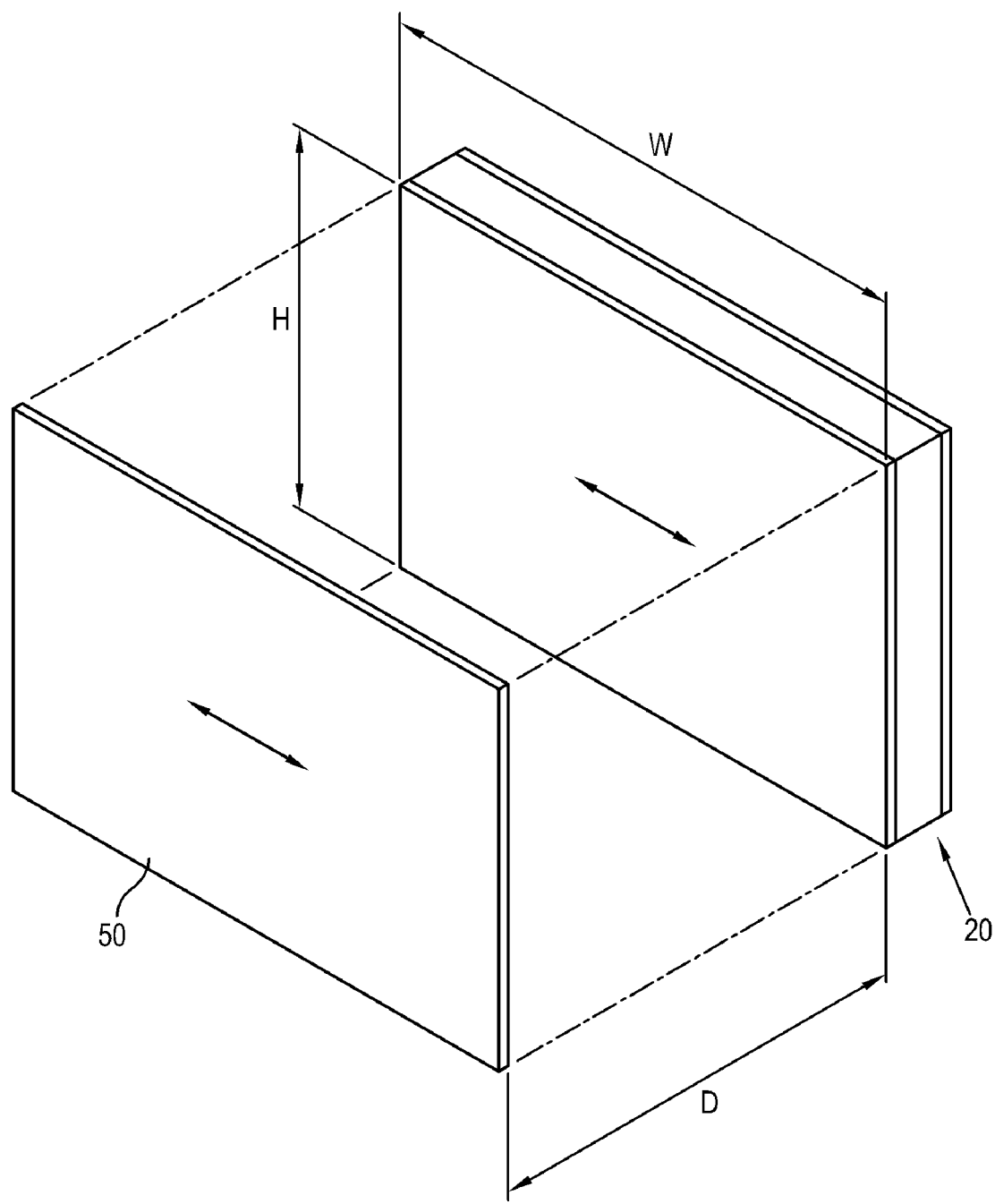
FIG. 4 illustrates a size of the liquid crystal panel and a distance between the liquid crystal panel and a polarizing filter.

FIG. 4 illustrates a size of the liquid crystal panel 20 and a distance between the liquid crystal panel 20 and the polarizing filter 50.

Referring to FIG. 4, a distance D between the liquid crystal panel 20 and the polarizing filter 50 can be determined, for example, in consideration of a size of the liquid crystal panel 20. That is, if other conditions are equal, a larger liquid crystal panel receives more solar radiant energy. Then, the liquid crystal is very likely to be damaged. Considering such circumstances, the distance D can satisfy a following formula 1.

$$0.005 \leq D/L \leq 0.1 \qquad \text{[Formula 1]}$$

$$L = (H^2 + W^2)^{1/2}$$

Here, H refers to a height of the liquid crystal panel 20, W is a width of the liquid crystal panel 20, D is the distance D between the liquid crystal panel 20 and the polarizing filter 50, and L is a diagonal length of the liquid crystal panel 20.

In the formula 1, a lowest value is a value where boundary layers of air flow in the liquid crystal panel 20 and the polarizing filter 50 meet each other when the liquid crystal panel 20 and the polarizing filter 50 are cooled by the first and second fans 71 and 73. If D/L is out of the lowest value, air flow between the liquid crystal panel 20 and the polarizing filter 50 is fully developed. Thus, a convective heat transfer coefficient is drastically reduced.

In the formula 1, a highest value of D/L does not exist in the thermal aspect. If D/L is out of the highest value of the formula 1, a thickness of front and rear surfaces of the LCD device is very thick compared to a screen size, creating limitations in an installing space.

Figure 5:
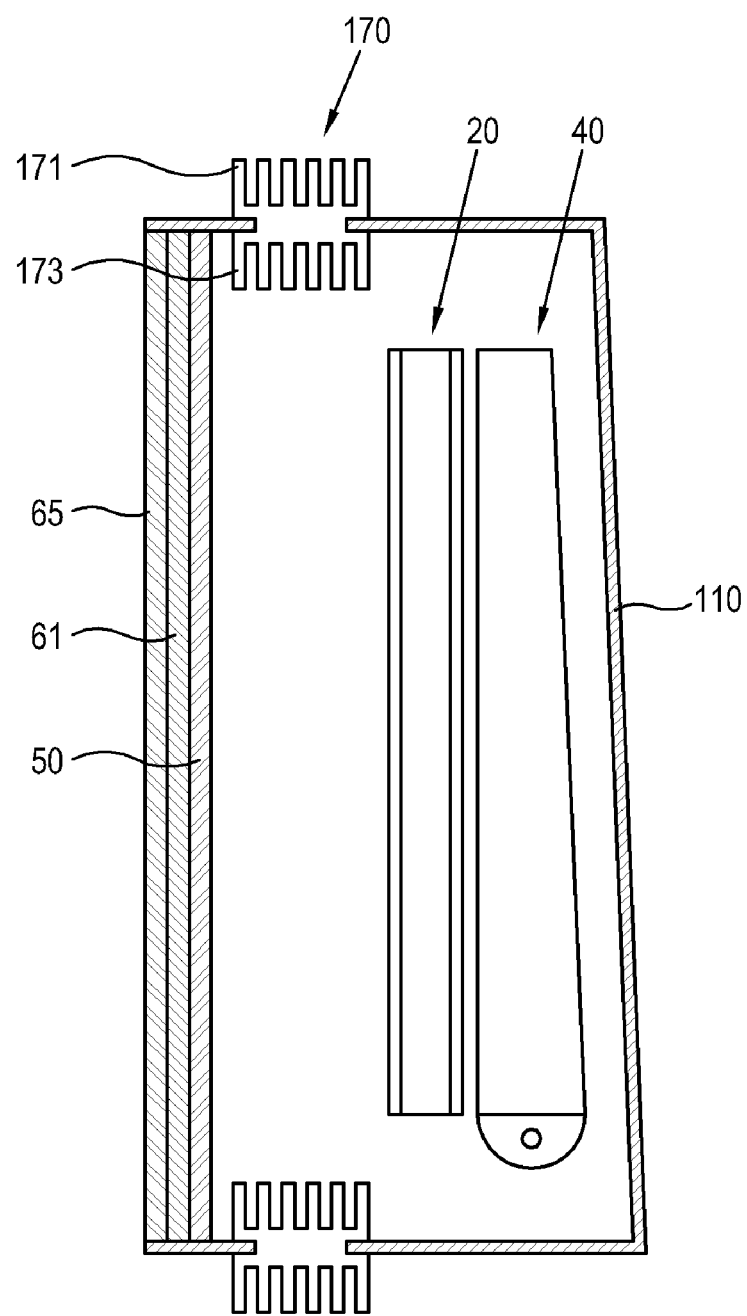
FIG. 5 is a sectional view of a LCD device according to another exemplary embodiment of the present general inventive concept.

FIG. 5 is a sectional view illustrating a LCD device according to another exemplary embodiment of the present general inventive concept.

As illustrated therein, the LCD device according to the present embodiment includes a housing 110, and a liquid crystal panel 20, a backlight unit 40 and a polarizing filter 50 which are provided in the housing 110. The LCD device may further include an infrared filter 61, an ultraviolet filter 65 and a heat radiating member 170. The LCD device according to the present embodiment is differentiated from that according to the exemplary embodiment, illustrated in FIG. 2, in that the housing 110 is a closed configuration and a configuration of the heat radiating member 170 is changed.

As the housing 110 is a closed configuration, air does not circulate in and around the housing 110 unlike in the exemplary embodiment. Thus, external impurities are not introduced to the housing 110 fundamentally.

The heat radiating member 170 is provided in and outside of the housing 110. The heat radiating member 170 includes a heart absorber 171 which is provide in the housing 110 to absorb heat from an internal space of the housing 110, and a heat radiator 173 which is provided out of the housing 110 to discharge heat absorbed by the heat absorber 171 to the outside. The heat absorbed by the heat absorber 171 is applied to the heat radiator 173, and the heat radiator 173 discharges the heat to the outside of the housing 110. Thus, the inside of the housing 110 may be cooled.

FIG. 5 illustrates a heat sink having a plurality of heat radiating fins as an example of the heat radiating member 170, but not limited thereto. Alternatively, the heat radiating member 170 may include a heat pipe. As a configuration and an operation of the heat pipe is known, detailed description will be avoided.

As described above, the LCD device according to various embodiments of the present general inventive concept includes an additional polarizing filter spaced from a liquid crystal panel within a housing to block other light than predetermined polarized light of incident light. Thus, even if the LCD device is installed outside, direct emission of solar radiant energy to the liquid crystal panel may be eased. Even if installed outside, the liquid crystal panel of the LCD device may be prevented from being overheated.

The LCD device according to various embodiments of the present general inventive concept further includes an infrared filter and an ultraviolet filter as well as the polarizing filter to block light in the infrared area and the ultraviolet area included in solar radiant energy to protect the liquid crystal panel from the solar radiant energy more efficiently.

The LCD device according to various embodiments of the present general inventive concept further includes a heat radiating member to cool the liquid crystal panel and a polarizing filter in a housing. As internal temperature of the housing is lowered, internal temperature of the housing may be prevented from rising.

Since the LCD device according to various embodiments of the present general inventive concept does not use a liquid blocking plate protruding outwardly, a wide viewing angle may be secured and limitation of an installing space may be reduced.

Although various exemplary embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A liquid crystal display device, comprising:
    a housing;
    a liquid crystal panel provided in the housing and comprises one or more polarizing plates to transmit light in a predetermined polarized direction and block other light;
    a backlight unit disposed in the housing to emit surface light to the liquid crystal panel; and
    a polarizing filter disposed in the housing, and spaced from the liquid crystal panel to transmit predetermined polarized light and to block other polarized light of incident light.

2. The liquid crystal display device according to claim 1, further comprising:
    a heat radiating member to introduce external air to a space between the liquid crystal panel and the polarizing filter or to discharge internal air from the housing to the outside.

3. The liquid crystal display device according to claim 2, wherein the heating radiating member comprises:
    at least one fan provided in a rear side of the housing.

4. The liquid crystal display device according to claim 2, wherein the heat radiating member comprises:
    a heat absorber provided in the housing to absorb heat; and
    a heat radiator provided outside of the housing to discharge the heat absorbed by the heat absorber to the outside.

5. The liquid crystal display device according to claim 1, further comprising:
    an infrared filter provided at a lateral side of the polarizing filter to block light in the infrared area among incident light; and
    an ultraviolet filter provided at a lateral side of the infrared filter to block light in the ultraviolet area among the incident light.

6. A liquid crystal display device, comprising:
    a housing;
    a liquid crystal display unit provided in the housing to form an image; and
    a polarizing filter disposed in the housing, and spaced from a front of the liquid crystal display unit to transmit predetermined polarized light and to block other polarized light of incident light.

7. The liquid crystal display device according to claim 6, wherein the liquid crystal display unit comprises:
    a liquid crystal panel comprising:
        first and second transparent substrates spaced from each other at predetermined intervals and filling a liquid crystal in an internal space formed between the transparent substrates;
        at least one transparent electrode formed in the first and second transparent substrates; and
        at least one polarizing plate provide in an external part of the first and second transparent substrates and transmit light in a predetermined polarized direction; and
    a backlight unit emitting a light to the liquid crystal panel to transmit the light through the liquid crystal to display the image.

8. The liquid crystal display device according to claim 6, further comprising:
    a heat radiating member to introduce external air to a space between the liquid crystal display unit and the polarizing filter or to discharge internal air from the housing to the outside.

9. The liquid crystal display device according to claim 8, wherein the heating radiating member comprises at least one fan provided in a rear side of the housing.

10. The liquid crystal display device according to claim 8, wherein the heat radiating member comprises:
    a heat absorber provided in the housing to absorb heat; and
    a heat radiator provided outside of the housing to discharge the heat absorbed by the heat absorber to the outside.

11. The liquid crystal display device according to claim 6, further comprising:
    an infrared filter provided at a lateral side of the polarizing filter to block light in the infrared area among incident light.

12. The liquid crystal display device according to claim 6, further comprising:
    an ultraviolet filter provided at a lateral side of the polarizing filter to block light in the ultraviolet area among the incident light.

13. The liquid crystal display device according to claim 6, further comprising:
    an infrared filter provided at a lateral side of the polarizing filter to block light in the infrared area among incident light; and
    an ultraviolet filter provided at a lateral side of the infrared filter to block light in the ultraviolet area among the incident light.

* * * * *